(12) United States Patent
Zoestbergen et al.

(10) Patent No.: US 10,167,972 B2
(45) Date of Patent: Jan. 1, 2019

(54) VALVE FOR HIGH TEMPERATURE LIQUID

(71) Applicant: TATA STEEL NEDERLAND TECHNOLOGY B.V., Velsen-Noord (NL)

(72) Inventors: Edzo Zoestbergen, Alkmaar (NL); Theodorus Franciscus Jozef Maalman, Uitgeest (NL); Colin Commandeur, Beverwijk (NL); Stephan De Bruijn, Beverwijk (NL)

(73) Assignee: TATA STEEL NEDERLAND TECHNOLOGY B.V., Velsen-Noord (NL)

( * ) Notice: Subject to any disclaimer, the term of this patent is extended or adjusted under 35 U.S.C. 154(b) by 19 days.

(21) Appl. No.: 15/317,589

(22) PCT Filed: Jun. 9, 2015

(86) PCT No.: PCT/EP2015/025030
§ 371 (c)(1),
(2) Date: Dec. 9, 2016

(87) PCT Pub. No.: WO2015/188950
PCT Pub. Date: Dec. 17, 2015

(65) Prior Publication Data
US 2017/0130854 A1   May 11, 2017

(30) Foreign Application Priority Data
Jun. 11, 2014   (EP) .................................... 14002006

(51) Int. Cl.
*F16K 25/00* (2006.01)
*B22D 1/00* (2006.01)
(Continued)

(52) U.S. Cl.
CPC ............ *F16K 25/005* (2013.01); *B22D 1/005* (2013.01); *B22D 11/005* (2013.01);
(Continued)

(58) Field of Classification Search
CPC .......... F16K 25/005; F16K 5/04; F16K 5/045; B22D 1/005; B22D 11/00; B22D 11/005; B22D 11/064; B22D 41/14; B22D 41/16
See application file for complete search history.

(56) References Cited

U.S. PATENT DOCUMENTS 3,559,662 A * 2/1971 Iezzi ..................... C23C 14/246
137/1
3,948,316 A * 4/1976 Souriau ................. F28D 15/043
165/104.26
(Continued)

FOREIGN PATENT DOCUMENTS

| CN | 201875233 U | 6/2011 |
|----|-------------|--------|
| CN | 103723667 A | 4/2014 |

(Continued)

OTHER PUBLICATIONS

International Search Report and Written Opinion dated Oct. 14, 2015 for PCT/EP2015/025030 to Tata Steel Nederland Technology B.V. filed Jun. 9, 2015.
(Continued)

*Primary Examiner* — Ian G Paquette
(74) *Attorney, Agent, or Firm* — Vorys, Sater, Seymour and Pease LLP

(57) ABSTRACT

A valve for a high temperature liquid, more in particular for liquid ZnMg, wherein the valve parts are made of ceramic material and graphite to be heat-resistant against the temperature of these liquid metals.

16 Claims, 1 Drawing Sheet

(51) Int. Cl.
  *B22D 11/00*   (2006.01)
  *B22D 11/06*   (2006.01)
  *C23C 14/24*   (2006.01)
  *F16K 5/04*    (2006.01)
  *F16K 5/02*    (2006.01)

(52) U.S. Cl.
  CPC .......... *B22D 11/064* (2013.01); *C23C 14/246* (2013.01); *F16K 5/025* (2013.01); *F16K 5/04* (2013.01); *F16K 5/045* (2013.01)

(56) References Cited

U.S. PATENT DOCUMENTS

| | | | | |
|---|---|---|---|---|
| 3,964,535 | A | 6/1976 | Bedell et al. | |
| 4,023,355 | A * | 5/1977 | McDonald | F02K 9/26 137/625.33 |
| 6,835,449 | B2 * | 12/2004 | Kim | B82Y 30/00 251/359 |
| 2008/0078453 | A1 * | 4/2008 | Sander | F16K 25/005 137/375 |
| 2014/0161691 | A1 * | 6/2014 | Feraud | B01D 11/04 423/5 |

FOREIGN PATENT DOCUMENTS

| | | |
|---|---|---|
| JP | H08120450 A | 5/1996 |
| JP | 2013194902 A | 9/2013 |
| KR | 20110034420 A | 4/2011 |

OTHER PUBLICATIONS

Boron Nitride (BN)—Properties and Information on Boron Nitride, pp. 1-7, URL: <http://www.azom.com/article.aspx?ArticleID=78>, retrieved from the Internet Dec. 9, 2016.

Combat® Machinable Ceramics (Solids), Saint-Gobain, Boron Nitride, Machinable Ceramics, "Combat® BN Machinable Ceramics, Grade HP", URL: <http://www.bn.saint-gobain.com/machinable-ceramics>, retrieved from the Internet Dec. 9, 2016.

BoronNitride—Properties and Applications of GradeHP BNCeramics by Precision Ceramics, pp. 1-5, URL: <http://www.azom.com/article.aspx?ArticleID=4482>, retrieved from the Internet Dec. 9, 2016.

Combat® BN Machinable Ceramics (Solids), Saint-Gobain, Boron Nitride, Machinable Ceramics, "Combat® BN Machinable Ceramics, Grade AX05", URL: <http://www.bn.saint-gobain.com/machinable-ceramics>, retrieved from the Internet Dec. 9, 2016.

* cited by examiner

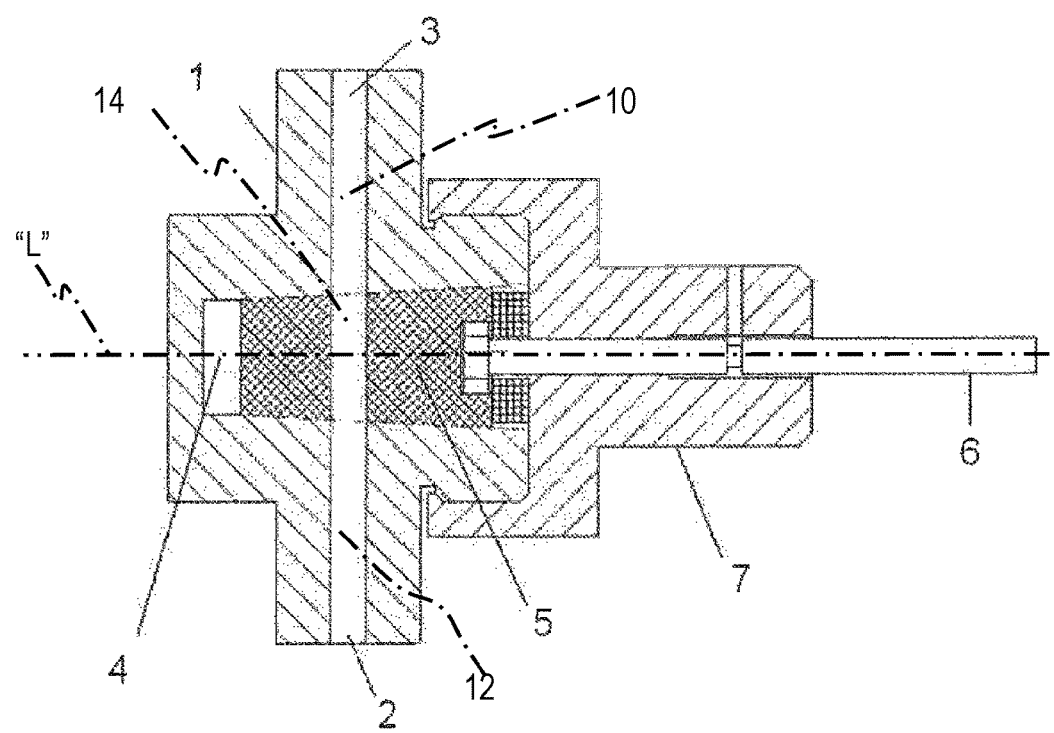

VALVE FOR HIGH TEMPERATURE LIQUID

CROSS-REFERENCE TO RELATED APPLICATIONS

This is a § 371 National Stage Application of International Application No. PCT/EP2015/025030 filed on Jun. 9, 2015, claiming the priority of European Patent Application No. 14002006.6 filed on Jun. 11, 2014.

FIELD OF THE INVENTION

The invention relates to a valve for a high temperature liquid, more in particular liquid metal or a liquid of two or more metals.

BACKGROUND OF THE INVENTION

In physical vapour deposition (PVD) a metal is vaporized and deposited on a substrate, such as a steel strip. In this process a liquid metal or a liquid of two or more metals is supplied to an evaporator in a vacuum chamber where it is vaporized. In PVD processes and more in particular in continuous or semi-continuous PVD processes on an industrial scale it is necessary to regularly supply liquid metal to the evaporator device to make up for the liquid metal evaporated from the evaporator.

For the supply of liquid metal to the evaporator a supply system is used comprising a feeding vessel with liquid metal, heated pipes between the vessel and evaporator, one or more valves to shut off and open the flow in the pipes and depending on the system one or more pumps to pump the liquid metal. The vessel with liquid metal is located outside the vacuum chamber.

In order to safely start and shut down the PVD installation it is essential that a valve is present in the piping between feeding vessel and the evaporator melt. This will assure that when the piping is empty the vacuum chamber will not be vented. Furthermore, during the shut down procedure or during an emergency situation the valve will make it possible to shut off the supply of liquid metal in a controlled and safe manner.

Liquid metal is used to provide an anti-corrosive coating on a steel strip and usually contains Zn or Zn and Mg which metals are both very reactive in the liquid phase. The material of the valve that comes into contact with the liquid ZnMg should not only be capable to withstand the corrosive action of this liquid metal but it should also be dense enough to prevent penetration of the liquid metal into the material, since such penetration could sooner or later lead to failure of the material.

Furthermore, it is not enough that the material of the valve is resistant against ZnMg. Oxides present on the material, formed by the material and any excess oxygen must be stable enough to liquid ZnMg to assure that the valve will continue to work.

OBJECTIVES OF THE INVENTION

It is an objective of the present invention to provide a valve that can be operated under high temperature conditions.

It is an objective of the present invention to provide a valve wherein the material of the valve is resistant against the corrosive action of liquid metal, more in particular liquid ZnMg.

It is another objective of the present invention to provide a valve wherein the material of the valve is dense enough to prevent penetration of the liquid metal into the material.

It is another objective of the present invention to provide a valve wherein the material of the valve is such that an oxide formed on the material will be stable under these conditions.

DESCRIPTION OF THE INVENTION

According to a first aspect of the invention one or more of the objectives of the invention are realized by providing a valve for high temperature liquid comprising a valve body, a valve seat, input and output connections, a valve closure member provided with a passageway, a valve cover member and a valve spindle connected to the valve closure member, wherein the parts of the valve that come into contact with the liquid are provided with a coating of a material or are made of a material that is resistant against the high temperature liquid.

To make a proper valve it is not only required that the used materials are resistant against liquid and or gaseous ZnMg, these materials should preferably also have the following features:

The material must be dense enough to assure that no penetration of the ZnMg is occurring.

A possible oxide formed on the part must not be reduced by the ZnMg liquid. Otherwise, due to the sequential oxidation and reduction steps the material will wear.

Thirdly, the different parts of the valve must not cause fretting when the valve is being operated.

Preferably the material(s) is/are thermo shock resistant.

Preferably the material(s) must be resistant to air in the temperature interval from 450 to 850° C.

The expansion of the material in specified temperature range much be such that any anisotropic expansion will not hinder the valve from working.

Finally, it must be possible to obtain the material in the required seizes and it must be machinable.

The results are summarised below.

| Material | Penetration and/or Reaction? | Thermal shock resistance |
|---|---|---|
| Fused SiO2 | R | Y |
| Al2O3 | No | N |
| ZrO2 (Yttria stabilized) | No | Y |
| Hex BN | P, R | Y |
| HP BN (AX05) | P | Y |
| HIP BN | No | Y |
| Layered BN | P | Y |
| ZrO2-BN | P, R | Y |
| SiC-ZrO2-BN | R | Y |
| CaO-BN | P, R | Y |
| Si3N4-BN | P, R | Y |
| Si3N4 | No | Y |
| Graphite (porosity 18%) | P | Y |
| Tungsten | No (oxide reduced) | Y |
| Cast Iron | R | Y |
| Steel | R | Y |

The list above has been used to select materials to produce valves from.

In a first embodiment according to the invention a valve is provided wherein the parts of the valve that come into contact with the liquid are provided with a coating selected from a group consisting of graphite, BN, ZrO, Al2O3 and Si3N4. The part to which the coating is applied is made from steel, stainless steel, bronze or any other metal or alloy that is strong enough at the specified temperature interval, does not react destructively with the coating and preferably can withstand atmospheric conditions.

In a second embodiment according the invention the valve closure member is made of graphite and the valve body is made of hot isostatic pressed boron nitride (HIP BN). The graphite is preferable a higher density grade of graphite, such as graphite with a porosity of 18% or less. Preferably graphite is used with a porosity lower than 18% in order to minimize penetration of ZnMg in the voids in the graphite as much as possible, for instance graphite with a porosity of 15% or 12% or even less. From the materials on the list these materials are the easiest to machine. It was found that a valve made of HIP BN parts that are to be moved with respect to each other will show fretting. Furthermore the thermal expansion of HIP BN is very anisotropic which will result in a valve that can not be operated at elevated temperatures. A valve made of a HIP BN and a high density graphite part has to proven to work but because of the use of graphite the working temperature of the valve is limited up to 500° C.

Furthermore by providing that the valve closure member of graphite is at least partially surrounded by HIP BN the oxidation of graphite, which will normally occur under atmospheric conditions, is suppressed. Because of this construction it is possible to use this valve under atmospheric conditions at temperatures up to 850° C.

For a valve with solid parts of a single material also $Al_2O_3$ could be used but this material has the disadvantage of a bad thermal shock resistance. Also Si3N4 could be used for the purpose but it is difficult to machine the material to the required dimensions for this kind of valve.

According to a further aspect of the invention it is provided that also the valve cover member is made of HIP BN. With a valve body and a valve cover member of HIP BN the graphite valve closure member is surrounded on all sides by HIP BN.

BRIEF DESCRIPTION OF THE DRAWINGS

The invention will be further explained on hand of the example shown in the drawing, which shows a schematic drawing of the valve in cross-section.

DETAILED DESCRIPTION OF THE DRAWINGS

The valve comprises a valve body 1 provided with an inlet connection 2 and an outlet connection 3 and a valve seat 4 which accommodates valve closure member 5. Valve closure member 5 is provided with a passageway which connects to inlet and outlet channels respectively when turned in a position corresponding with these channels. The valve closure member is provided with a spindle 6 which extends through valve cover member 7 and is to be operated by mechanical or electro-mechanical means. The valve closure member 5 is made from HIP BN and the valve body 1 and the valve cover member 7 from a high density graphite. The valve closure member 5 is rotatable and provided with a passageway 14 for the high temperature liquid. The valve closure member 5 is rotatable from an open position wherein the valve closure member passageway 14 is aligned with a valve body ingress passageway 10 and a valve body egress passageway 12 (as shown in FIG. 1) to a closed position wherein the valve closure member passageway 14 is not aligned with the valve body ingress passageway 10 and egress passageway 12. The valve closure member 5 is seated in the valve seat in the open position and the closed position. The rotatable valve closure member 5 within the valve body 1 is rotatable about a longitudinal axis "L" of the rotatable valve closure member 5 but not axially moveable along the longitudinal axis "L".

This is a two way valve but it is also possible to make a three way valve using the materials as disclosed.

The invention claimed is:

1. A valve for high temperature liquid comprising:
   a valve body,
   a valve seat,
   input and output connections,
   a valve closure member provided with a passageway,
   a valve cover member, and
   a valve spindle connected to the valve closure member,
   wherein the parts of the valve that come into contact with the liquid are provided with a coating of a material or are made of a material that is resistant against the high temperature liquid,
   wherein the valve closure member is made of graphite and the valve body is made of HIP BN, wherein the valve cover member is made of HIP BN.

2. The valve according to claim 1, wherein the graphite has a porosity of 18% or less.

3. The valve according to claim 1, wherein the graphite has a porosity of 15% or less.

4. The valve according to claim 1, wherein the graphite has a porosity of 12% or less.

5. The valve according to claim 1, wherein the coating is selected from the group consisting of graphite, BN, ZrO, Al2O3 and Si3N4.

6. The valve according to claim 5, wherein the parts to which the coating is applied are made from steel, stainless steel, titanium, nickel, copper, brass or bronze.

7. The valve according to claim 1, wherein the high temperature liquid is a liquid containing at least one metal.

8. The valve according to claim 7, wherein the liquid is liquid ZnMg.

9. The valve according to claim 1, wherein the spindle is made from steel, stainless steel, titanium, nickel, copper, brass or bronze.

10. The valve according to claim 9, wherein the graphite has a porosity of 18% or less.

11. The valve according to claim 9, wherein the graphite has a porosity of 15% or less.

12. The valve according to claim 9, wherein the graphite has a porosity of 12% or less.

13. A system for supplying liquid metal to an evaporator device, the system comprising the valve according to claim 1.

14. The system according to claim 13, wherein the graphite has a porosity of 18% or less.

15. The system according to claim 13, wherein the graphite has a porosity of 15% or less.

16. The system according to claim 13, wherein the graphite has a porosity of 12% or less.

* * * * *